United States Patent [19]

Montagu

[11] Patent Number: 5,225,770
[45] Date of Patent: Jul. 6, 1993

[54] MOVING MAGNET GALVANOMETERS HAVING A VARIED DENSITY WINDING DISTRIBUTION COIL FOR A DESIRED PERFORMANCE CHARACTERISTIC

[75] Inventor: Jean Montagu, Brookline, Mass.

[73] Assignee: General Scanning, Inc., Watertown, Mass.

[21] Appl. No.: 660,705

[22] Filed: Feb. 25, 1991

[51] Int. Cl.⁵ .............................................. G01R 1/20
[52] U.S. Cl. ................................. 324/146; 324/151 A
[58] Field of Search ............. 324/97, 146, 147, 151 R, 324/151 A, 149

[56] References Cited

U.S. PATENT DOCUMENTS

| | | | |
|---|---|---|---|
| 2,999,966 | 9/1961 | Beyner et al. | 318/132 |
| 3,434,082 | 3/1969 | Montagu | 335/229 |
| 3,435,311 | 3/1969 | Matsuzawa et al. | 318/129 |
| 3,644,763 | 2/1972 | Skrobisch | 310/36 |
| 3,970,979 | 7/1976 | Montagu | 335/229 |
| 4,076,998 | 2/1978 | Montagu | 318/132 |
| 4,110,879 | 9/1978 | Burke, Jr. | 29/25.42 |
| 4,142,144 | 2/1979 | Rohr | 324/61 R |
| 4,183,191 | 7/1978 | Kawamura et al. | 310/49 R |
| 4,302,720 | 11/1981 | Brill | 324/146 |
| 4,528,533 | 7/1985 | Montagu | 335/230 |
| 4,694,235 | 9/1987 | Flowers | 318/662 |
| 4,959,568 | 9/1990 | Stokes | 310/51 |
| 5,046,154 | 9/1991 | MacManus | 324/146 |

OTHER PUBLICATIONS

Clifton Precision, 1 page Brochure (Drawings) Jan. 1990.
Harowe Servo Controls, Inc., "Brushless Torque Motors" for Limited Angle Applications, 1 page Brochure, Jan. 1990.
Acroflex Laboratories, Inc., "Outline Drawings Brushless DC Torque Motor", 1 page Brochure, Jan. 1990.
Fisher, "Torque Motors", 1 page Brochure, Jan. 1990.
Laser Beam Scanning, edited by Gerald Marshall, published by Marcel Dekker, Inc., New York, N.Y. (1985), pp. 83-91, by Jean Montagu.
M. Levnat, "Toothless Motors Advantages of toothless brushless DC motors", Motion, pp. 26-27, Nov./Dec., 1988.
J. Montagu, "Update of Scanner Selection, Performances and Multi-Axis Configurations", SPIE, vol. 1454, Beam Deflection and Scanning Technologies, 1991.

Primary Examiner—Walter E. Snow
Attorney, Agent, or Firm—Fish & Richardson

[57] ABSTRACT

A galvanometer is shown, which includes a cylindrical magnetic rotor polarized into two essentially semi-cylindrical poles on opposite sides of its axis. Two coil portions are disposed on opposite sides of the rotor, separated by a plane of symmetry that is in essential alignment with the poles of the rotor at the center of its range of motion. The legs of each grouping of turns of each coil portion are disposed in a distribution beginning at a point corresponding to the radial surface of the bobbin on which the coil portion is wound, and extending continuously substantially to the plane of symmetry. The distribution may be lower in density at the plane of symmetry than spaced therefrom and may approximate an inverse cosine distribution. A rotor is shown that includes a thin-walled torque-bearing sleeve encircling at least a portion of the magnet and is joined to the output shaft and the magnet. A fastener anchors the bobbin to the shell to prevent relative rotation therebetween. A position transducer is linked to the rotor outside of the space between the bearings to favorably affect the first resonance of the rotor. A winding fixture is shown, and the process of making the coils is described.

24 Claims, 15 Drawing Sheets

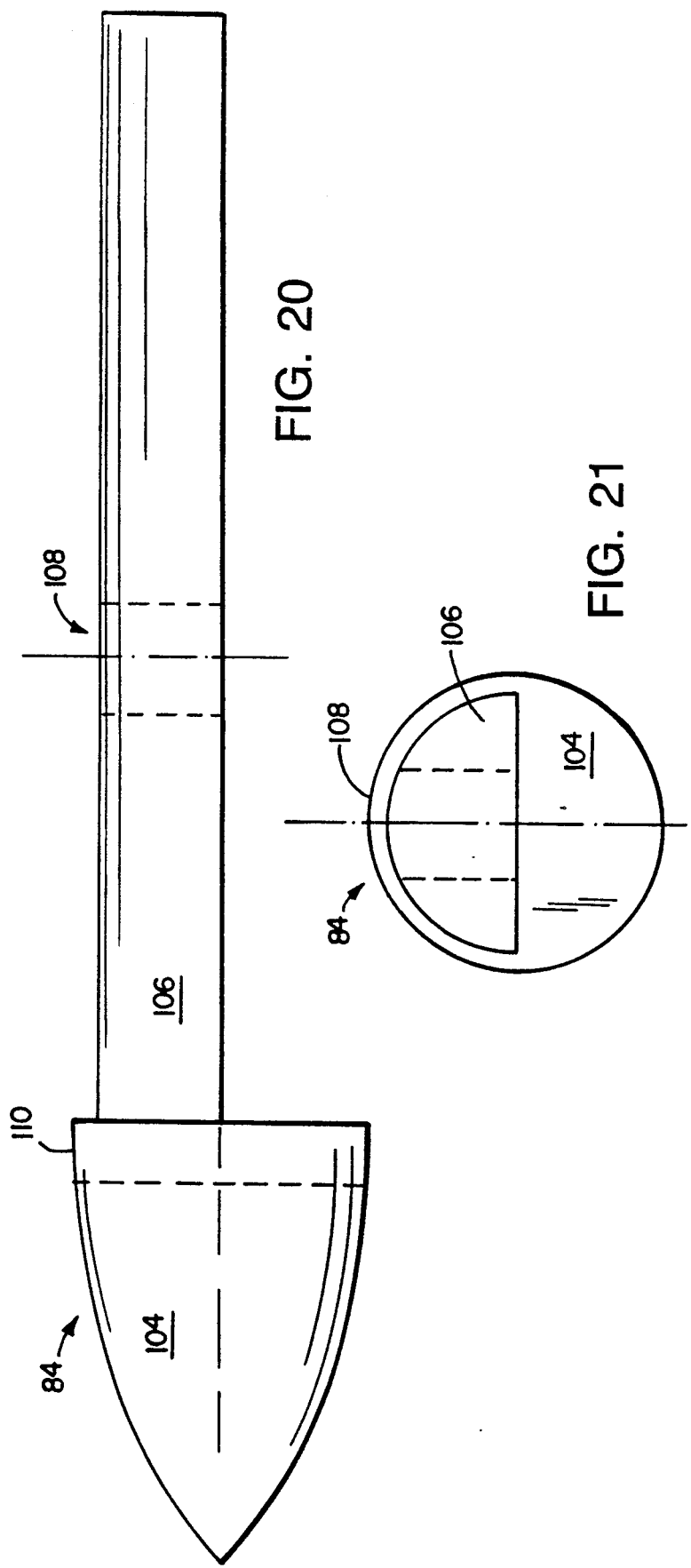

MOVING MAGNET GALVANOMETERS HAVING A VARIED DENSITY WINDING DISTRIBUTION COIL FOR A DESIRED PERFORMANCE CHARACTERISTIC

BACKGROUND OF THE INVENTION

This invention relates to limited rotation oscillatory motors or galvanometers, and more particularly to that class capable of delivering significant torque (sometimes referred to as torque motors).

A common use of these devices is to drive optical elements such as mirrors for the purpose of guiding light beams. This type of device is often called a scanner. Scanners have a wide angle of rotation, typically more than 15 degrees.

One of the needs in the industry is a strong and accurate high frequency scanner for operation in various electro-optical devices, such as those used in engraving or laser trimming of precision resistors. Higher frequency devices allow for faster and/or more precise operation.

There are a number of types of galvanometers that are known. Common types include the moving coil or so-called D'Arsonval galvanometer, the moving iron galvanometer and the moving magnet galvanometer. Each has its own characteristics and limitations. The invention relates to the moving magnet type.

Moving magnet torque motors fall into three basic types. The first is the imbedded coil design exemplified by U.S. Pat. Nos. 4,302,720 and 3,434,082. They are typically air gap and high inductance devices well suited in ALNICO type magnets. The second type includes a torroid wound on a metal core. Typical of this type are the torque motors marketed by Aeroflex, Clifton and Harowe. Their construction limits them to comparatively low acceleration. Typically they cannot be wound efficiently when their length exceeds a fraction of the diameter. The third type, including the design of U.S. Pat. No. 4,076,988, for example, have a moving magnet device where the coil is stationary and the armature which defines the field rotates. The invention relates to this last class of torque motors.

The parameters that govern the performance of such motors include the torque to inertia ratio, which expresses the acceleration capability, the electrical time constant, which burdens the drive electronics, and the first uncontrollable resonant frequency, which limits the stability of a servo system involving the motor.

Prior designs of moving magnet galvanometers have employed through holes through the magnetic material for clamping the shafts to the magnet. This has been necessitated to assure strong and fixed relationship of the shafts to the magnet material when the magnet is moved as a result of the changing magnetic field imposed upon it.

Certain desirable magnet materials, such as neodymium iron boron, tend to have thermal coefficients of expansion that are different along different axes of the material. Because of this, and because of the varied thermal environments to which these devices are often exposed, a galvanometer rotor magnet made of this type of material may expand significantly in one direction while contracting significantly in the other direction.

SUMMARY OF THE INVENTION

In general, the invention features a galvanometer including a cylindrical magnetic rotor mounted for rotary oscillation about a central axis, and being polarized into two essentially semi-cylindrical poles on opposite sides of the axis. Two coil portions are disposed on opposite sides of the rotor, with each coil portion defined by a large multiplicity of conductive turns, and each turn comprised of conductive side legs extending along the length of the rotor and conductive end portions connected to the respective side legs of the turn. The first and second side legs of the turn are grouped together in respective first and second groupings of conductive legs, with the groupings being spaced apart from each other circumferentially. There is a plane of symmetry through the axis between the coil portions. The legs of each grouping of turns of each coil portion are disposed in a distribution beginning at a point corresponding to the radial surface of the bobbin on which the coil portion is wound, and extending continuously substantially to the plane of symmetry, the poles of the rotor being in essential alignment with the plane at the center of the range of motion of the galvanometer.

In another aspect, the invention features a galvanometer including a magnet rotor adapted to rotate about an axis, and a stator concentric with the rotor and including a coil having axial winding portions on opposite sides of the axis and a plane of symmetry passing through the axis and separating the axial coil portions, the coil having a varied winding density distribution that is lower in density at the plane of symmetry than spaced therefrom.

In another aspect, the invention features a torque motor comprising a rotor including a magnet having two ends, and a rear shaft and an output shaft, each in abutting relationship to one of the magnet ends. The torque motor also includes a thin-walled torque-bearing sleeve encircling at least a portion of the magnet and being joined to the output shaft and the magnet.

In another aspect, the invention features a moving magnet scanner suitable to drive an optical element such as a mirror in a rotational oscillatory motion, comprising a stationary outer shell, a stator potted with structural potting material to a coil wound around a bobbin disposed within the shell, the stator comprised of an anchoring hole disposed toward the shell, a rigid fastener element fitted in the hole, and extending to the shell, anchoring the stator to the shell to prevent relative rotational motion therebetween during acceleration of the scanner during which reactive forces are applied to the coil, and a magnet rotor polarized along its diameter and rotatably mounted in inner concentric relationship to the stator.

In another aspect, the invention features a galvanometer comprising a magnet rotor adapted to rotate about an axis, the rotor including an output shaft and a rear shaft on opposing ends of the rotor, an output bearing for connection to an external load, the output bearing rotatably holding the output shaft, a rear bearing rotatably holding the rear shaft, the bearing being placed at the opposite end of the rotor to the output bearing, and a position transducer linked to the rotor for generating a feedback signal in response to the rotation of the rotor, the position transducer being linked to the rotor outside of the space between the bearings, in order to minimize the distance between the bearings and consequently favorably affect the first resonance frequency of the rotor.

In another aspect, the invention features a bobbin comprising a cylindrical portion with inner and outer cylindrical surfaces, two cylindrical winding sections projecting from the outer surface on opposing sides of the cylindrical portion and each having an outer surface, longitudinal radial surfaces and first and second end surfaces, the central axis of the cylindrical sections and that of the cylindrical portion being essentially co-linear.

In another aspect, the invention features a winding fixture for accepting a bobbin having a cylindrical portion with inner and outer cylindrical surfaces, two cylindrical winding sections projecting from said outer surface on opposing sides of said cylindrical portion and each having an outer surface, longitudinal radial surfaces and first and second end surfaces, the central axis of said cylindrical sections and that of said cylindrical portion being essentially co-linear, said cylindrical sections defining a pair of anchor holes for accepting a fastener that holds said bobbin in place, the fixture comprising a pair of cylindrical sectional body portions, said body portions each having a pair of longitudinal radial surfaces, first and second end portions having curved surfaces, and an inner and outer surface both including aligned locator holes, said inner surface of said body portions being sized to hold the outer surface of one of the cylindrical sections of the bobbin, a pair of bullet plugs, each having a curved nose and a half cylindrical portion for insertion into the center of the cylindrical portion of said bobbin next to the half cylindrical portion of the other bullet plug, said half cylindrical portion including a locator hole, and a fixturing fastener for insertion through said locator holes in said body portions, the anchor holes in the bobbin, and the holes in the bullet plugs for holding said bobbin in place during winding.

In various preferred embodiments, the rotor is a freely rotating rotor; the distribution approximates a reciprocal cosine distribution; the distribution is determined by $$T = \frac{KBrLNiD}{a_o} \cos\gamma$$

wherein

T is the galvanometer's torque output,
Br is the constant residual inductance of the magnetic rotor,
K is a non-dimensional constant,
L is the magnetic rotor length,
N is the number of turns in the coil,
i is the current passing through the coil,
D is the base diameter at which the conductors are placed,
$a_o$ is the half-angle of the winding cavity, and
$\gamma$ is the angular position of the rotor; the variation of the winding extends over a range of +/− 45 degrees from the plane about the axis and the winding at the plane of symmetry has a density of about 70% of that at the outer limits of the range; the variation of the winding density distribution is selected to optimize performance of the coil for a given power dissipation of the coil; the sleeve and the output shaft are an integral part; the sleeve has an inertia that is less than 10% of that of the magnet; the sleeve is attached to the rear shaft; the sleeve and the magnet are bonded with a semi-flexible adhesive; the semi-flexible adhesive is a silicone bonding agent; the semi-flexible adhesive is an epoxy; the magnet is polarized along its diameter; the output shaft includes a butt end and the butt end is attached to the sleeve; the output shaft and the rear shaft include butt ends and the butt ends are attached to the sleeve; the output shaft is welded to the sleeve; the sleeve completely surrounds the magnet; the magnet is made of neodymium iron boron; the magnet is made of sumarium cobalt; the sleeve is made of stainless steel; the sleeve is made of titanium; the rotor has a length longer than its diameter; the rotor length is at least on the order of three times the rotor diameter or longer; the rotor is on the order of half an inch in diameter or smaller; the rotor is on the order of three sixteenths of an inch in diameter or smaller; the fastener is an axially extending element in the form of a pin or bolt; the position transducer is mounted on the rear shaft; the position transducer is mounted on the rear shaft by a screw engaged in threads of the rear shaft; the cylindrical sections definine a pair of anchor holes for accepting a fastener that holds the bobbin in place; the cylindrical winding sections further include generally beveled transition surfaces between the radial and the end surfaces; the cylindrical sections each further include annular segment end members, which extend from the winding sections at each end of each of the winding sections.

The invention is advantageous in that it provides for a small diameter and low-inertia rotor, which may be accelerated quickly. This allows the torque motor to be operated at high frequencies, in optical scanning, for example. A large amount of the volume within the rotor may be made of magnetic material providing for increased torque for a given volume. Magnetic material that has thermal coefficients of expansion that are different along separate axes may be accommodated. Because the bobbin of the invention is solidly anchored in place, the rotor may accelerate quickly, without dislodging the bobbin. The coil of the stator has a wiring density profile which maximizes the torque provided by the motor for a given amount of electric power because it allows for the use of a larger amount of copper for a given number of turns. The bobbin may be efficiently wound on a winding machine, and because it does not require wires to be wound around its inside surface, the resulting coil can have a small diameter. Since the position transducer is linked to the rotor outside of the space between the bearings, the bearings may be placed closer together, increasing the first resonant frequency of the device.

DESCRIPTION OF THE PREFERRED EMBODIMENT

Figure 1:
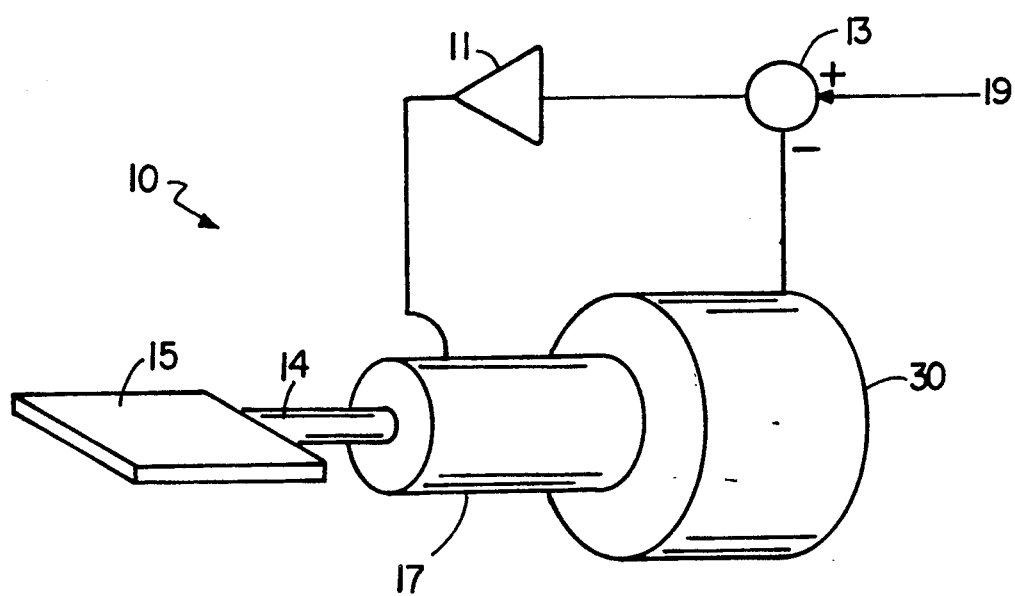
FIG. 1 is a schematic view of galvanometer as applied in a laser scanning system.
Figure 2:
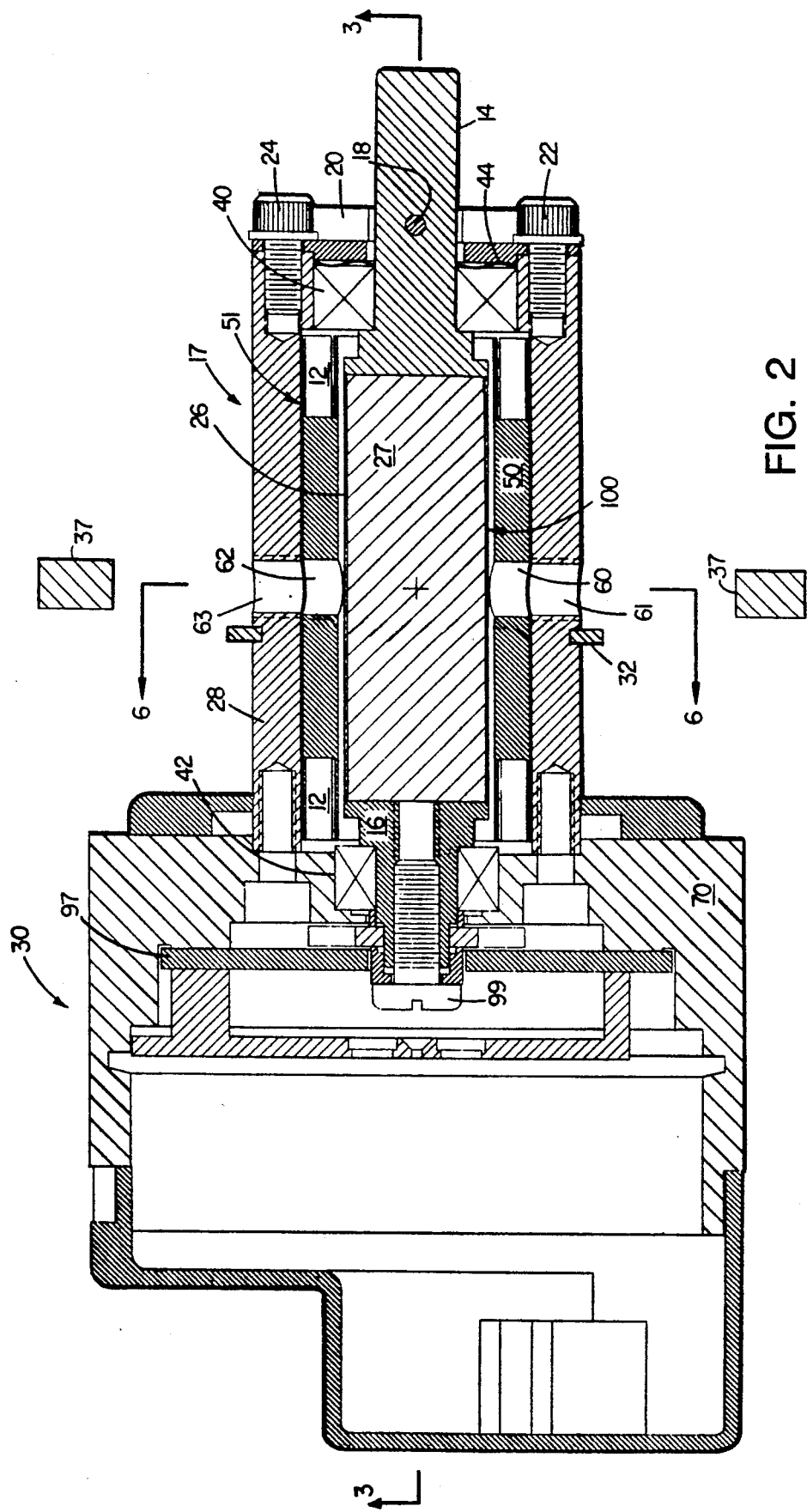
FIG. 2 is a longitudinal cross-section of the galvanometer and position transducer of FIG. 1, showing its associated fasteners in a removed position.
Figure 3:
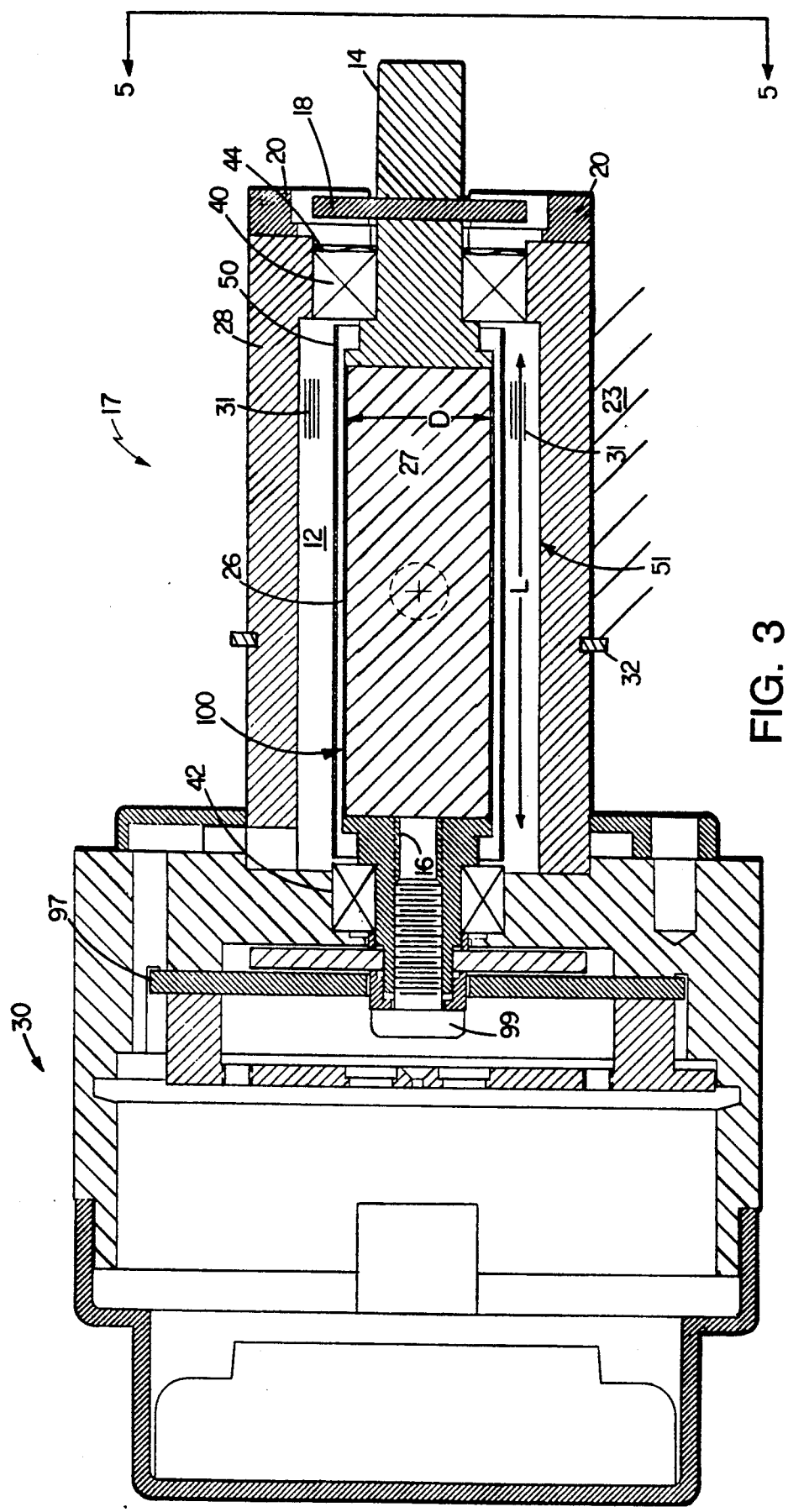
FIG. 3 is a longitudinal cross-section of the galvanometer and position transducer of FIG. 1 taken at right angles to the view of FIG. 2, along 3—3.
Figure 9:
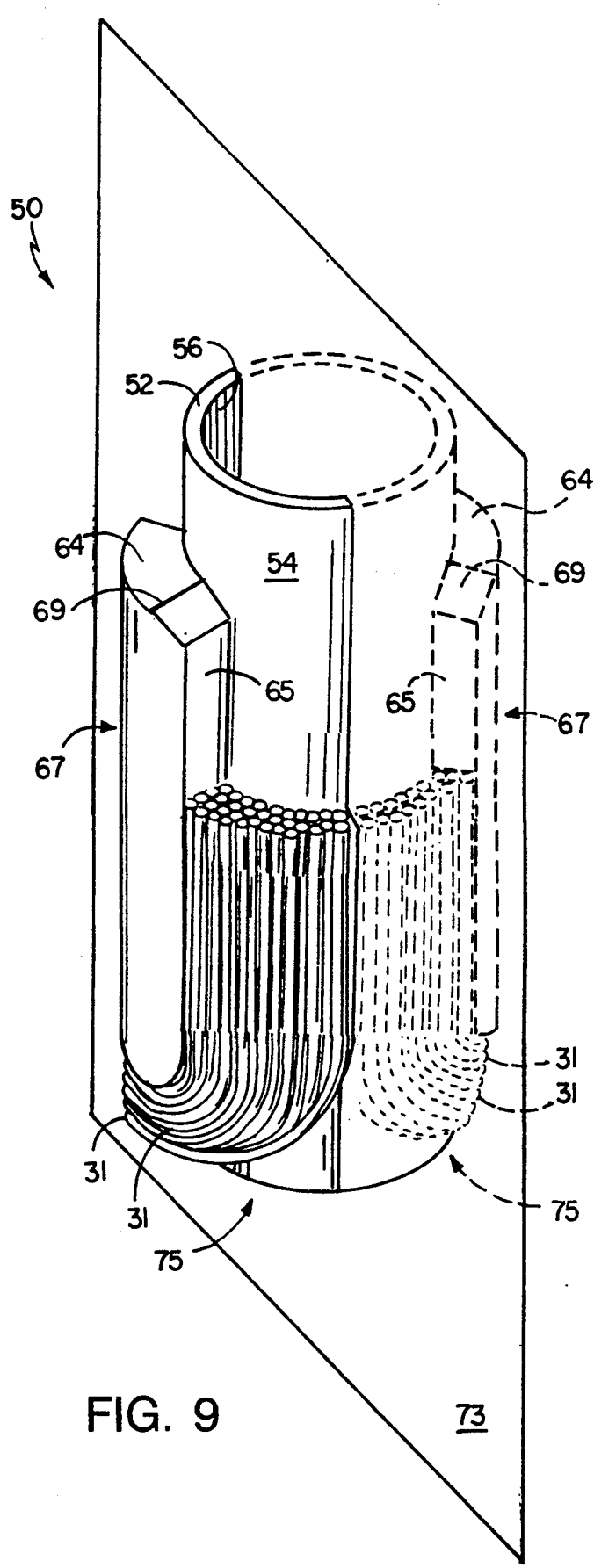

FIG. 9 is a vertical perspective of the bobbin of the torque motor of FIGS. 1-3, including the bottom half of its windings. The figure is bisected by a principle plane of symmetry, and features behind the plane are shown in broken lines. The bobbin's anchoring holes are excluded.

Figure 7:
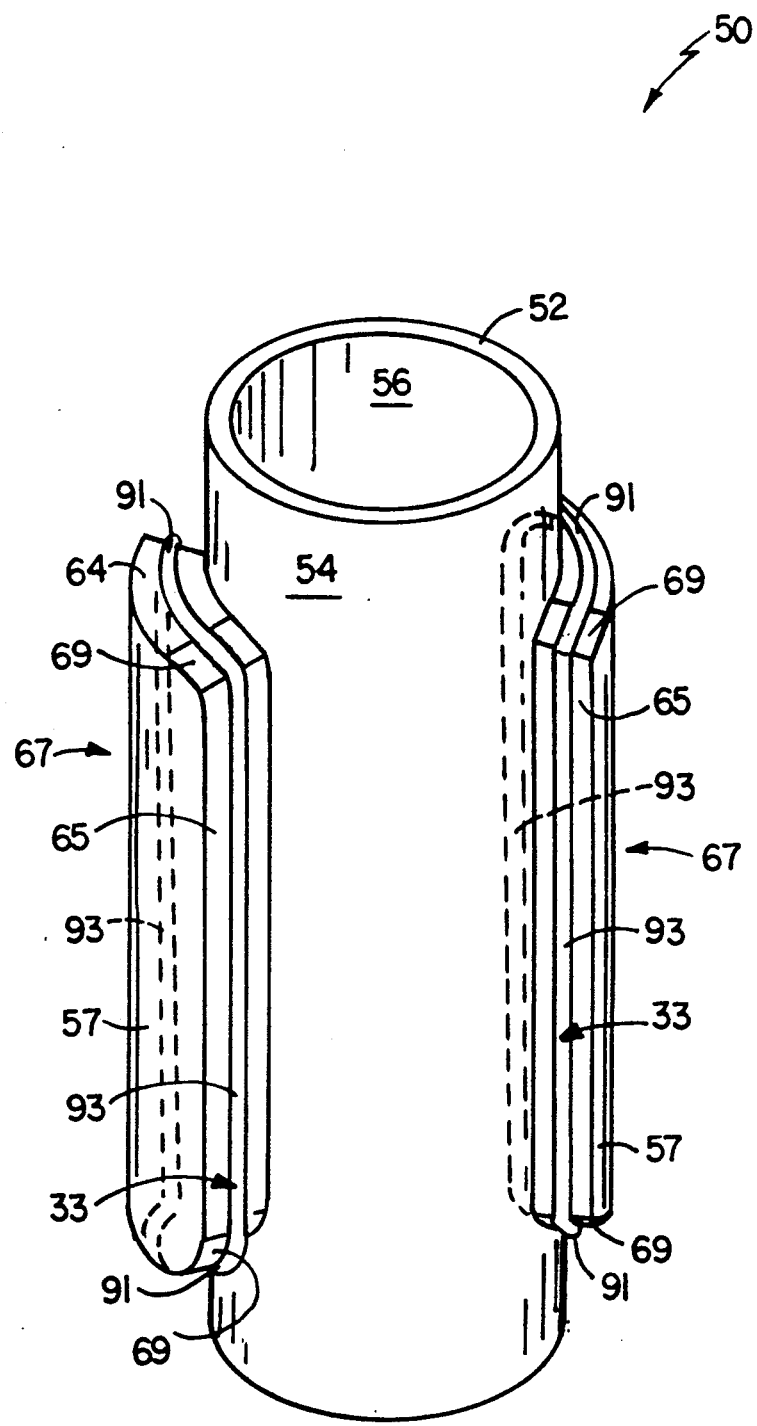
FIG. 7 is a vertical perspective view of the bobbin of the torque motor of FIGS. 1-3, diagrammatically showing the first turn of each of the coil portions, and excluding its anchoring holes.
Figure 10:
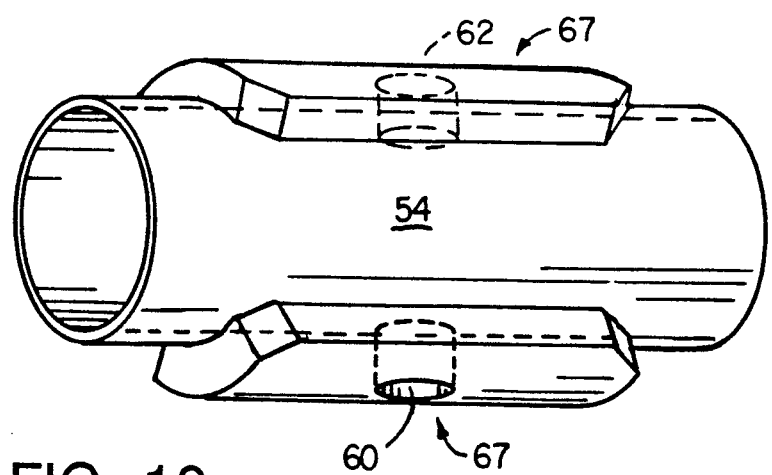

FIG. 10 is a horizontal perspective view of the bobbin of FIG. 7, showing its anchoring holes.

Figure 11:
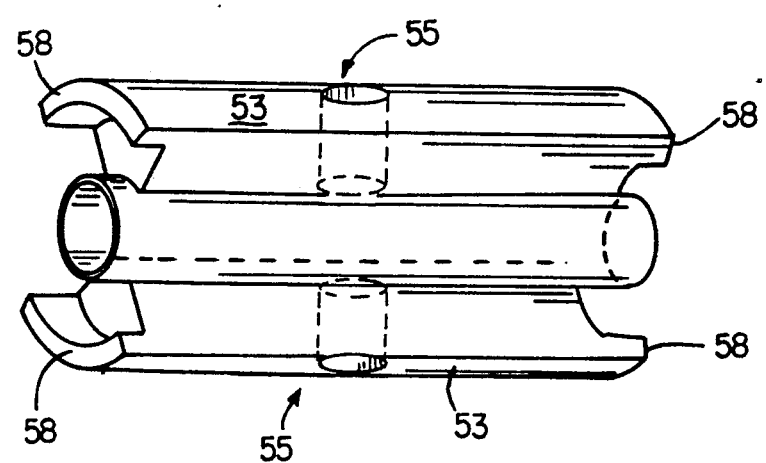

FIG. 11 is a horizontal perspective view of an alternate embodiment of the bobbin of FIG. 10.

Figure 12:
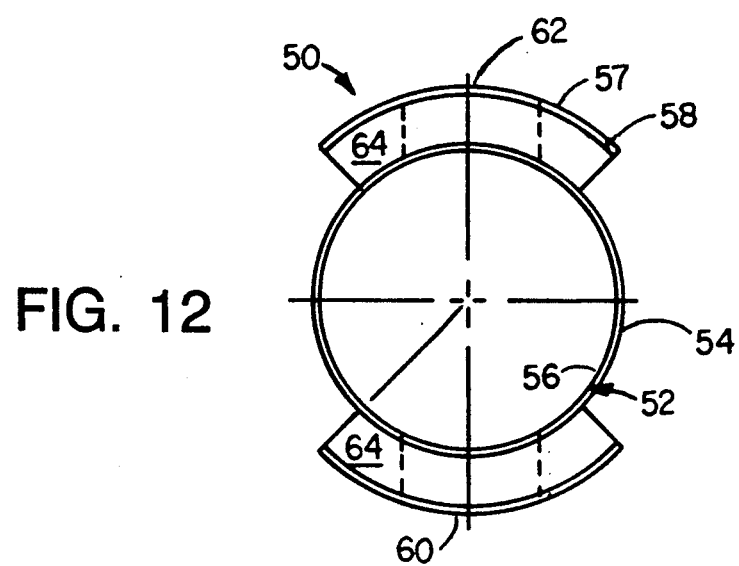

FIG. 12 is an end view of the bobbin of FIG. 11.

Figure 13:
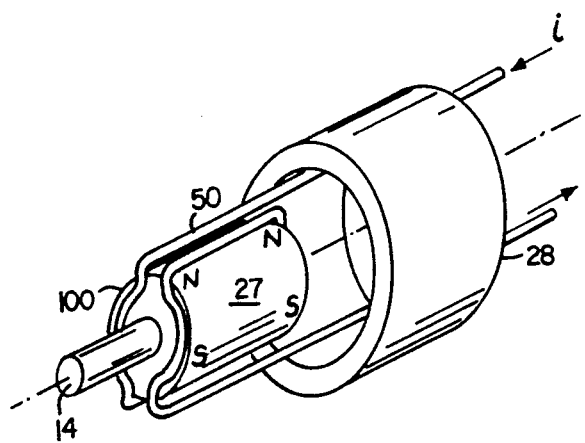

FIG. 13 is an isometric diagrammatic view of a rotor and coil assembly according to the invention.

Figure 14:
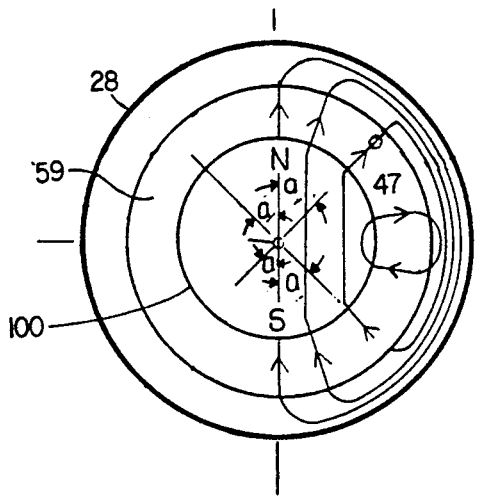

FIG. 14 is a diagrammatic elevation of the end of the assembly of FIG. 13 showing the flux lines due to the rotor.

Figure 15:
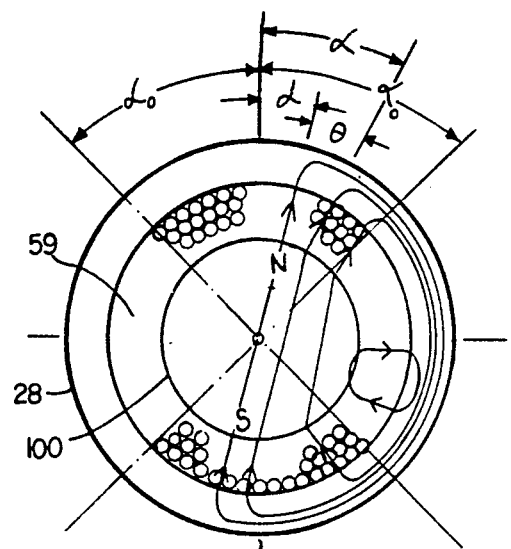

FIG. 15 is a diagrammatic elevation of the end of the assembly of FIG. 13 showing the flux lines due to the energized coil and the displaced rotor.

Figure 16:
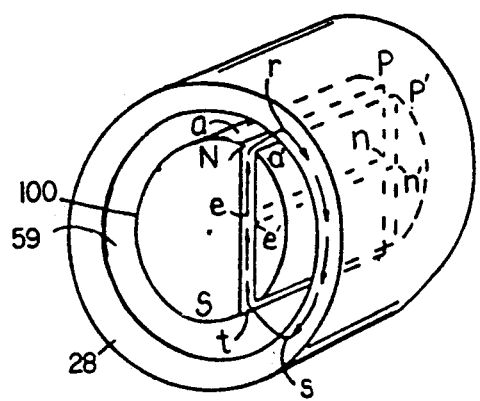

FIG. 16 is an isometric diagrammatic view of the rotor and stator of FIG. 13.

Figure 17:
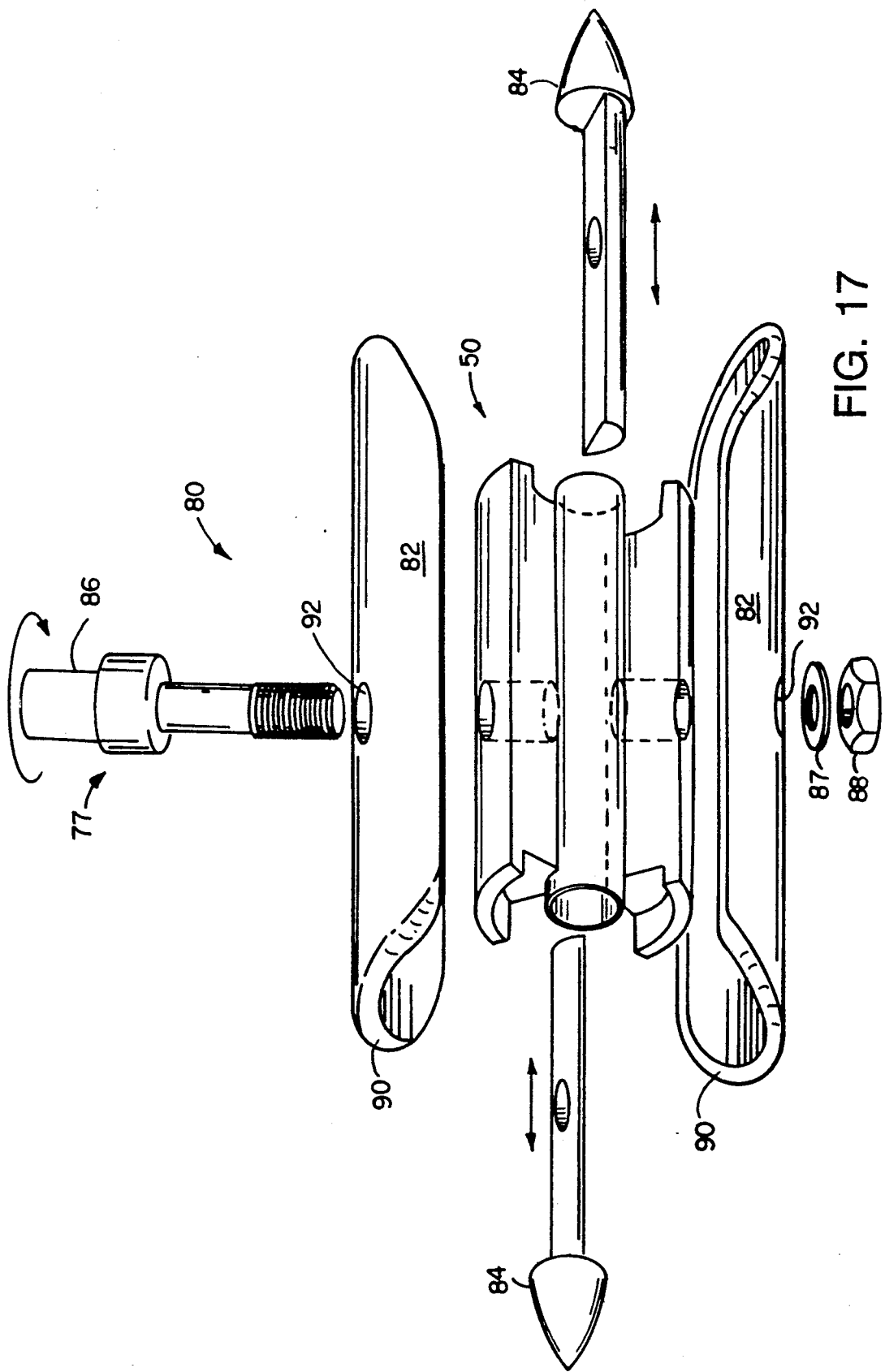

FIG. 17 is an exploded view of a winding fixture according to the invention.

Figure 18:
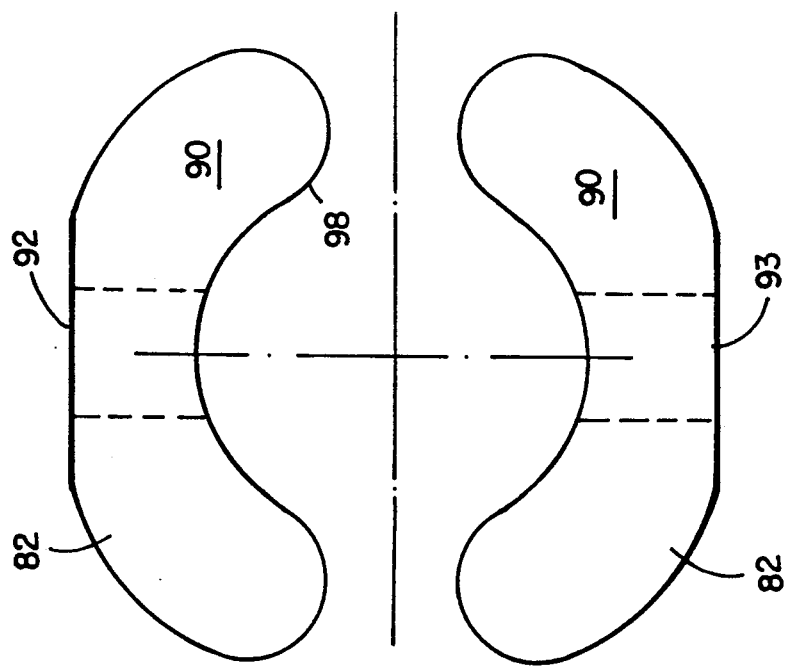

FIG. 18 is an end elevation of the body portions of the winding fixture of FIG. 17.

Figure 19:
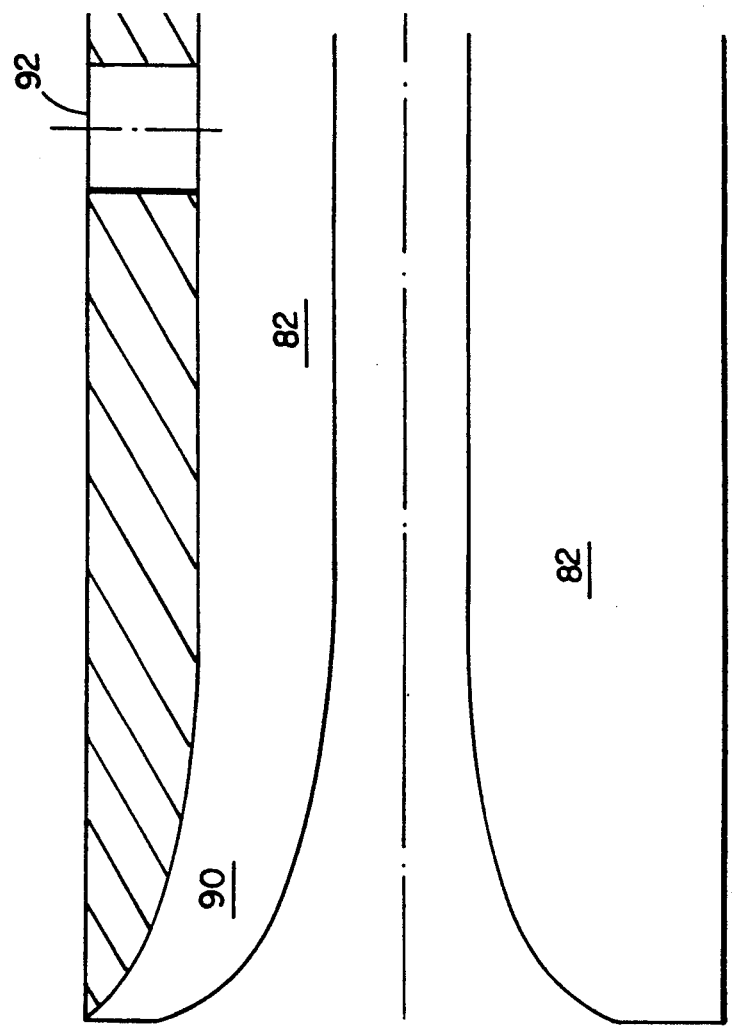

FIG. 19 is a side elevation of the body portions of the winding fixture of FIG. 17, showing details representative of both portions on the top portion only.

FIG. 20 is a side elevation of a bullet plug element of the winding fixture of FIG. 17.

FIG. 21 is an end elevation of a bullet plug element of the winding fixture of FIG. 17.

Figure 22:
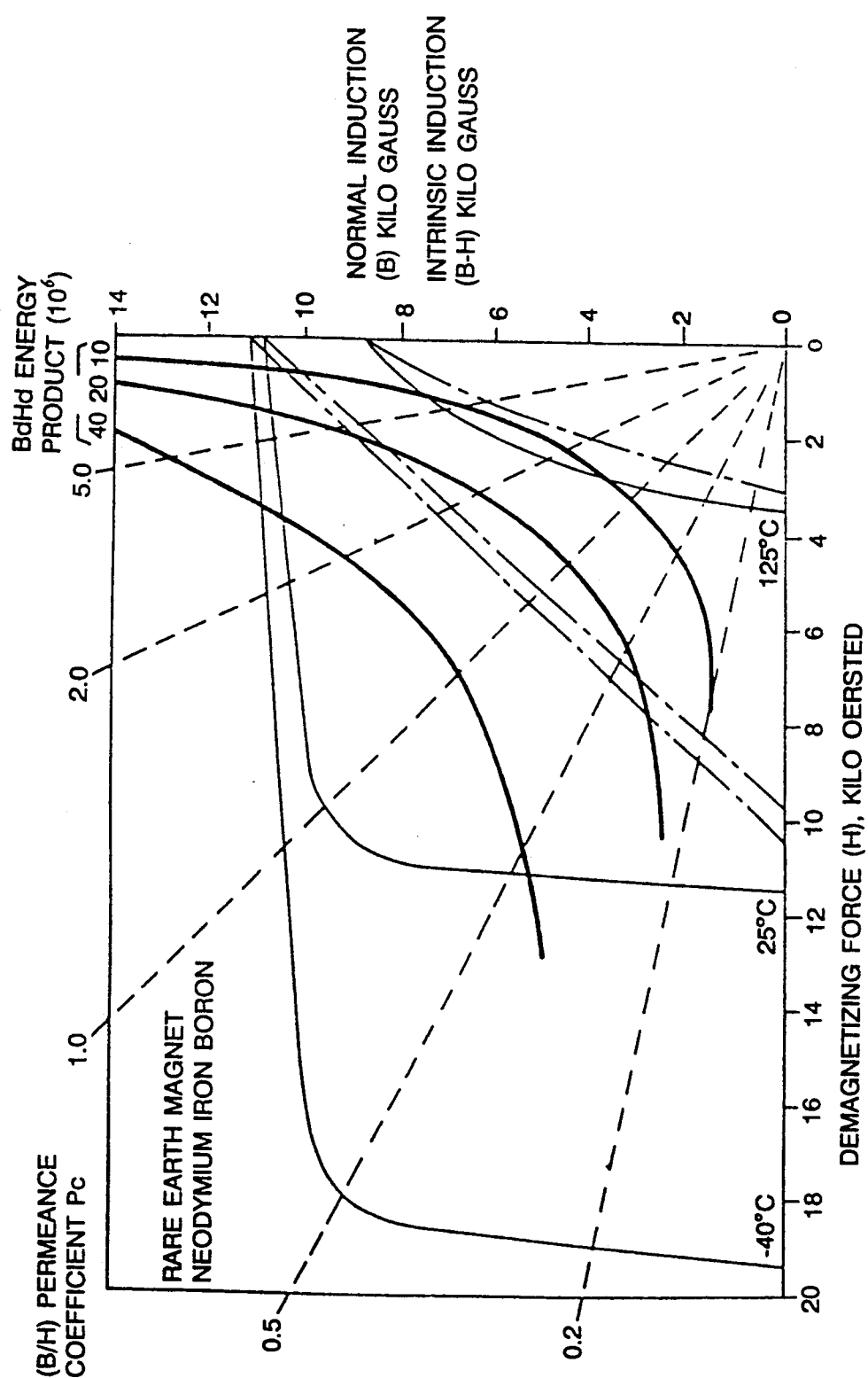

FIG. 22 shows a set of magnetization curves for neodymium iron boron.

Figure 23:
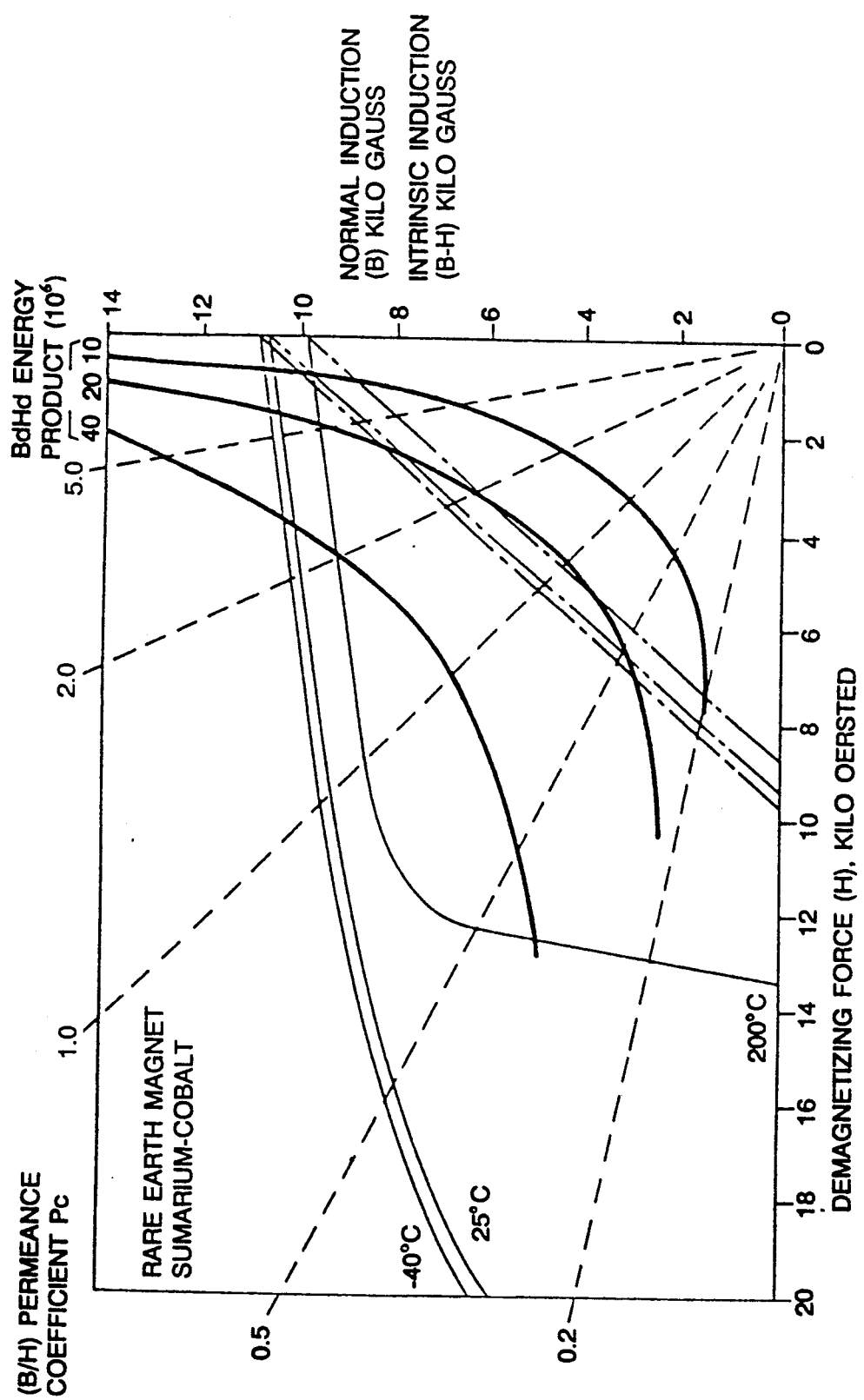

FIG. 23 shows a set of magnetization curves for samarium cobalt.

Referring to FIG. 1, a scanning system 10 includes a position transducer 30, such as a tachometer or a position sensor, and a torque motor 17. The torque motor 17 includes an output shaft 14, which is attached to a mirror 15. A subtraction circuit 13 is connected to the feedback output of the position transducer, and to the input of an amplifying circuit 11. The amplifying circuit 11 bears an output which is connected to the torque motor 17. A signal 19 may be applied to the subtractor 13,g which compares it with the feedback signal generated in response to the rotating motion coupled to the position transducer. The resulting signal is processed (e.g., amplified) and used to drive the torque motor. The torque motor then rotates the mirror 15, causing it to reflect in differing directions.

Figure 6:
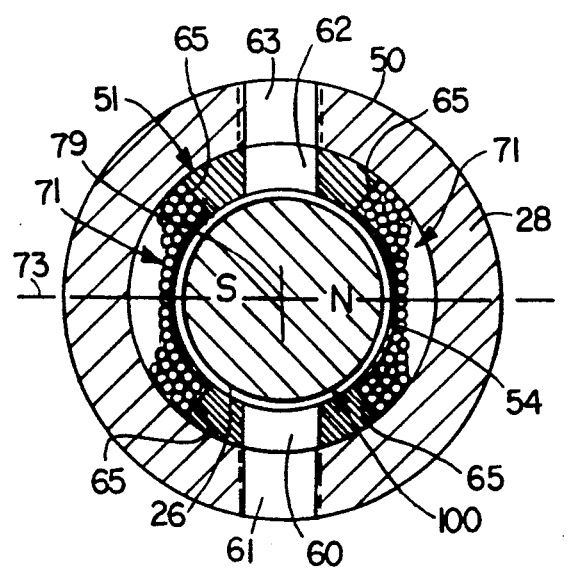
FIG. 6 is a cross section of the galvanometer of FIGS. 1-3 taken at 6—6.

Referring to FIGS. 2, 3 and 6, the torque motor 17 includes a magnetically permeable outer housing 28 that holds a stator 51. The stator is made up of a coil 12 made up of a large multiplicity of turns (or windings) 31 wound around a bobbin 50. A fastener 37 such as a pin or bolt sits in a pair of holes 60,62 in the bobbin 50 (see also FIG. 10) and corresponding holes 61,63 in the outer housing 28 to anchor the bobbin in place. The bobbin is also potted with a potting material (e.g., an epoxy) that fills the space between the bobbin and the housing to provide a heat conducive path for sinking the heat generated by the coil.

The stator surrounds a rotor 100 that is rotatably mounted on rear and front (or output) bearings 42,40 by its rear and front (or output) shafts 16,14, respectively. The bearings are preloaded with a pressure washer 44 which bears against the front stops 20. The rotor and stator are separated by a relatively narrow gap.

Figure 5:
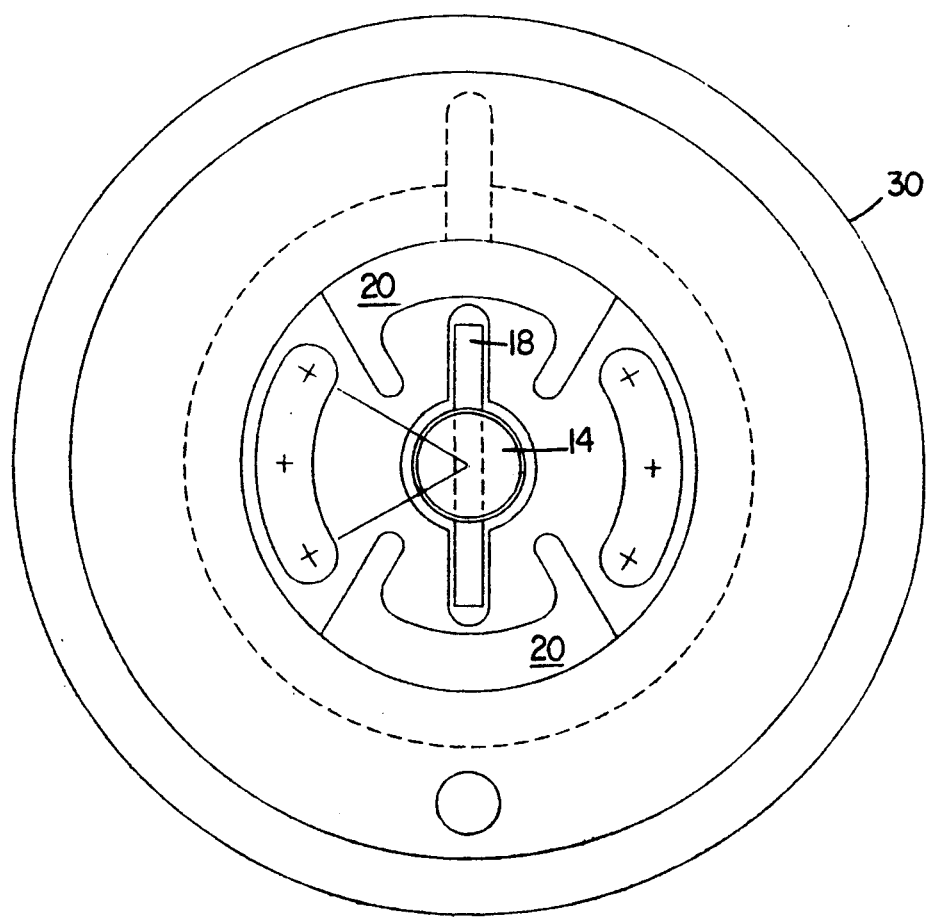
FIG. 5 is an end view of the galvanometer and position transducer of FIGS. 1-3, taken at 5—5 and excluding its stop bolts.

Referring now to FIGS. 2, 3 and 5, the output shaft 14 of the rotor 100 includes a moving stop 18 that is positioned to engage stationary stops 20 to limit the range of free rotation of the torque motor. The stationary stops 20 are held in position by bolts 22,24.

Referring to FIGS. 2 and 3, the rear shaft 16 is linked to the rotating portion 97 of the position transducer 30 opposite the rotor with respect to the rear bearing. The rear shaft and the rotating portion may be linked by a screw 99 engaged in threads of the rear shaft.

The torque motor 17 is typically installed by its housing 28, as indicated by hashing 23. This allows heat conduction away from the housing, which is typically made of steel. Reference stop 32 assists in this installation. The torque motor 17 and position transducer 30 may be installed as a unit.

Figure 4:
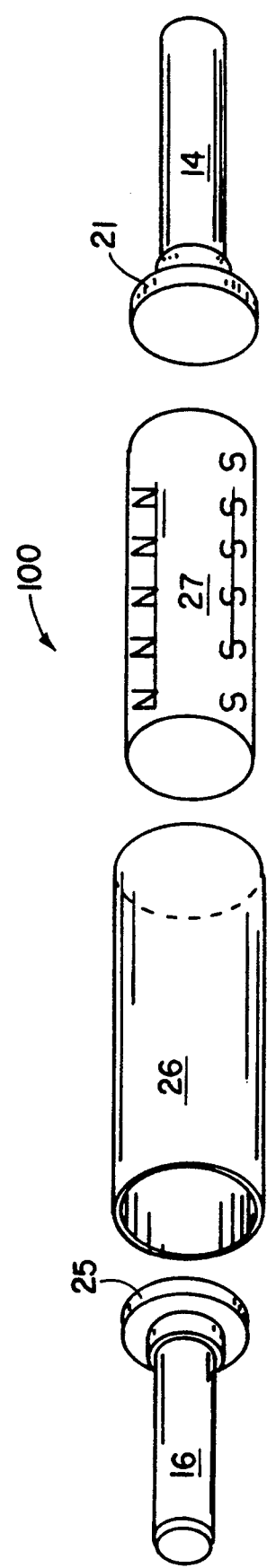
FIG. 4 is an exploded view of the rotor of the galvanometer of FIGS. 1-3, with the magnet shown at the center of its range of motion for the galvanometer orientation of FIG. 3.

Referring to FIG. 4, the rotor includes a sleeve 26 that holds a magnet 27 in place. The sleeve and magnet are held together by a semi-flexible adhesive, such as a silicone bonding agent or epoxy. Semi-flexible adhesives tend to flow under slow pressures, but are rigid under high force. The shafts 14,16 are in essentially abutting relationship with the sleeve and magnet. The butt portions 21,25 of the shafts are solidly joined (e.g., by spot welding, seam welding or laser welding) to the sleeve.

It is noted that it is more important to solidly join the sleeve to the output shaft than it is to attach it to the rear shaft, as more torque will be developed on the output joint. It is therefore possible to make the sleeve and output shaft out of a single piece and attach the rear shaft in some other fashion. It is also possible to use a partial sleeve that does not cover the whole surface of the magnet.

This thin-sleeved rotor construction has several advantages. First, for a given volume within the stator, it allows for a large amount of magnetic material as the shaft does not penetrate the magnet. This will result in stronger field than would result if part of the same magnet volume were occupied by an equivalently effective non-magnetic shaft. Conversely, a rotor with a given field strength can be made smaller using this technique.

It is particularly advantageous to make motors with smaller and longer rotors, for a given power requirement. This is because a motor with a small diameter and long length rotor will have a higher torque to moment of inertia ratio than would an equivalent motor with a longer diameter. This allows the rotor to accelerate faster and therefore operate at higher frequencies.

Referring to FIG. 6, the magnet 27 is magnetized to include generally semi-cylindrical north and south poles. When the rotor is in the center of its range of motion, as shown in the figure, the magnet's poles are roughly aligned along a principle plane of symmetry 73 of the device, which passes through the central axis 79 of the stator. This plane 73 is defined by the orientation of the magnetic material.

Because the magnet is bonded to the sleeve by a semi-flexible adhesive, the uneven thermal coefficients of desireable magnetic materials such as neodymium iron boron may be accommodated. A relatively large area is used for bonding as large forces are present at this bond. These stresses may be kept quite low, as they are spread over the whole outer surface of the magnet, as opposed to the smaller available surface when the magnet is mounted on an axle.

The sleeve may be made of stainless steel or titanium and may be approximately 2 to 10 thousandths of an inch thick. It has high torsional rigidity, while at the same time representing little (e.g., less than 10%) of the inertia of the rotor. Long rotors of quite small diameter may be made in this way (e.g., as small as 3/16 of an inch, yielding a bandwidth of better than 4 KHz). The rotor of the preferred embodiment has a diameter of 0.44 inches and a length of 1.35 inches, and its sleeve is 5 thousandths of an inch thick. The rotor is assembled in a jig fixture.

The stator 51 surrounds the rotor 100 and includes a bobbin 50 that forms two axially extending winding cavities 71, each defined by the inner surface of the housing 28, the outer winding surface 54 of the bobbin 50, and the axial surfaces 65 of the bobbin. Each of series of turns 31 passes through each winding cavity 71 to form two coil portions 75 (see also FIGS. 7-9) on the bobbin 50.

Referring to FIGS. 7-10, a bobbin suitable for use in the invention includes an inner cylindrical portion 52, with inner and outer surfaces 56,54. Two opposing beveled cylindrical winding sections 67 project from the outer surface 54 of the inner cylindrical portion. Each winding section 67 has radial surfaces 65, an outer surface 57, and end surfaces 64. Generally beveled transition surfaces 69 separate the end surfaces 64 and the radial surfaces 64. The bobbin may be manufactured by injection molding of a non-conductive plastic material such as nylon, glass-filled nylon, ABS or the like.

Referring to FIGS. 6-10, the coils are each wound on the winding sections 67 of the bobbin 50. This is done by first winding a first turn 33, around each winding section 67 as shown in FIG. 7. Each of these turns includes a pair of circumferentially spaced legs 93 and a pair of end portions 91 (see FIG. 7). Further similar turns 31 are wound around the first turns 33 to yield the two groupings 95 of legs that make up the coil portions 75 (see FIG. 8).

The resulting coil portions are symmetrical about the principal plane of symmetry 73, as shown in FIGS. 6 and 9. The two coil portions may be wound in the same operation using the same wire, or they may be wound consecutively and connected in series. The orientation of this coil, and the relative magnetic orientation of the rotor are shown diagrammatically in FIG. 13.

In operation, current passes through the coil 50, creating a magnetic field that interacts with the rotor magnet's 27 field and thereby imparts a torque on the rotor. The field lines due to the rotor alone are shown in FIG. 14, and the field lines resulting from interaction of fields are shown in FIG. 15.

Figure 8:
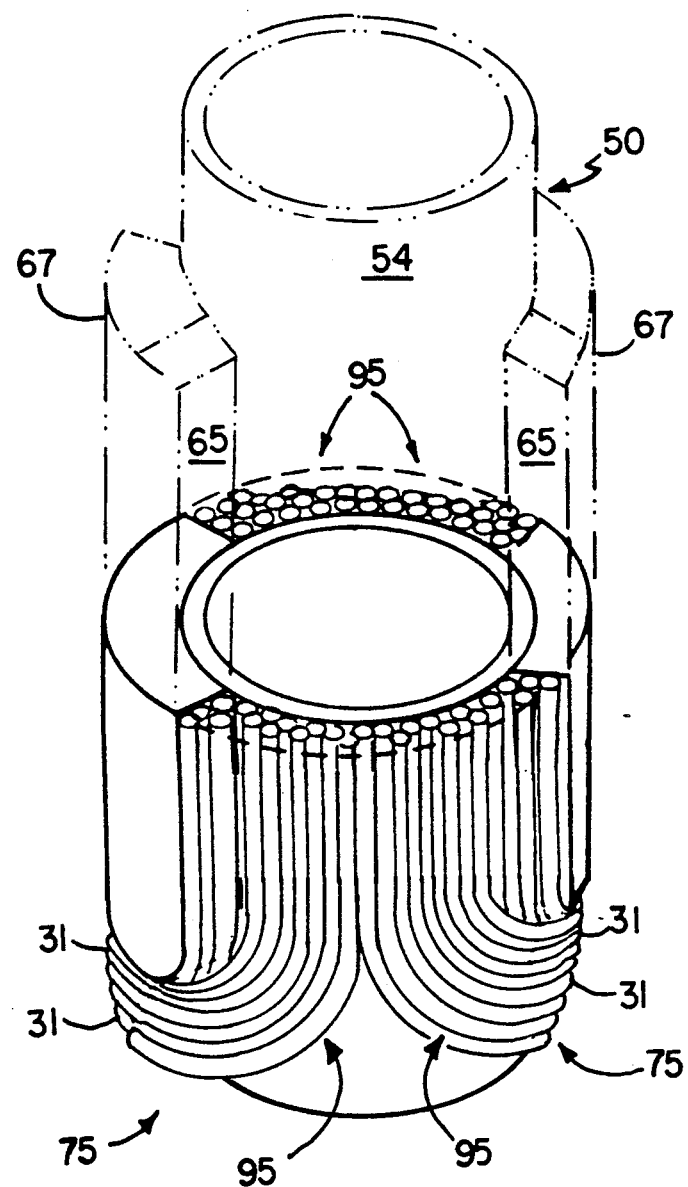
FIG. 8 is a sectioned vertical perspective view of the bottom half of a wound stator of the torque motor of FIGS. 1-3. The top half of the bobbin is shown in phantom, and its anchoring holes are excluded.

It will be shown below that a torque is generated when the magnet and coil are in the relationship shown in the figures. This relationship is at 90 degrees with respect to the orientation shown on U.S. Pat. No. 4,076,998. The magnitude of the torque imparted on the rotor 100 will depend on the magnitude of the field generated by the coil. More turns will provide a stronger field, and it is therefore advantageous to place turns in the whole circumferential dimension of the winding cavity 71. As will also be shown below, providing a variable radial winding density as shown in FIGS. 6, 8 and 9 further optimizes the torque for a given cavity geometry.

Referring generally to FIGS. 13-16 and 22-23, it shall first be shown that the field within the gap of a permanent magnet of highly anisotropic material and a shell of soft magnetic material with reference to the poles of the magnet, has a value:

$$B = K B_r \cos \theta \quad (1)$$

that depends on the angle $\theta$ between the axis of the magnet and the diameter on which segment 47 lies (i.e., 45°). $B_r$ is a constant residual inductance of magnet 26, and K is a non-dimensional constant (typically between 0.5 and 1) that depends on the geometry and particular magnetic material chosen, as well as the conditions of the shell (housing 28).

Referring in particular to FIGS. 16 and 22, the derivation of equation (1) is as follows:

The magnetic properties of a rare-earth anisotropic magnet at a typical operating range can be approximated by $$B_m = + H_m B_r / H_c + B_r \quad (2)$$

where $B_m$ is the induction, $H_m$ is the field intensity, $B_r$ is the residual inductance, and $H_c$ is the coercive force.

Applying Ampere's Law, $\int H \cdot dl = NI$ along path q-r-s-t of FIG. 16, assuming no currents are present, yields:

$$H_a \cdot 2 \cdot g + H_m \cdot d \cdot \cos \theta = 0 \quad (3)$$

where $H_a$ is the magnetic field intensity in the air gap 59, d is the diameter of magnet 27, and g is the width of the gap 59.

Gauss's law $\oint B \cdot da = 0$ can be applied to the elemental axial surface of the volume defined by the points a, a', p, p', n, n', e, e' where the material is sufficiently anisotropic that the field crosses only the boundaries of the surface a a' p p' and the surface e e' n n'. This yields:

$$B_m \cdot dA_m = B_a \cdot dA_a \quad (4)$$

where subscript "a" refers at section nn', pp' to the air gap and subscript "m" refers to the magnet material. Because $dA_m = dA_a \cdot \cos \theta$, equation (4) becomes $$B_m \cdot \cos \theta = B_a. \quad (5)$$

In the air gap, $$B_a = \mu H_a. \quad (6)$$

where $\mu$ is the permeability of air.

Equations (2) and (5) combine to yield:

$$B_a / \cos \theta = B_r(1 + H_m / H_c), \quad (7)$$

and equations (3) and (6) combine to yield $$2g B_a / \mu + H_m \cdot d \cos \theta = 0 \quad (8)$$

Equations (7) and (8) simplify to $$B_a = B_r \cos\theta / 1 + B_r/\mu H_c \cdot 2\, g/d) \quad (9)$$

Most rare earth magnets have $B_r/\mu H_c = 1.1$ and if g/d is small, typically less than 0.3, equation (9) simplifies to $$B_a = K \cdot B_r \cos\theta, \quad (10)$$

where
$0.5 < K < 1$,
which is the same as equation (1) (see also U.S. Pat. No. 4,959,568 entitled "Dynamically Tunable Resonant Device with Electric Control", herein incorporated by reference).

The derivation of the torque imparted to the magnet-rotor with respect to the shell-stator follows.

For the purpose of determining the torque, let us assume that the magnet and the shell are stationary and calculate the torque on a single conductor as shown in FIG. 13. It is given by Lorentz equation:

$$T = B\, L\, i\, D/2 \quad (11)$$

where B is the magnetic field at the conductor location on a base diameter D. The active length of the magnet is L.

To every torque there is an equal and opposite reaction. If the coil is used as a reference, the same torque acts upon the magnet and shell combination.

As the shell is concentric to the magnet and unpolarized as well as isotropic, the magnetic field angular location is only defined by the magnet. All the torque acts between the coil and the magnet. By mounting the coil to the housing, the torque acts between the housing and the magnet. It is necessary to anchor the coil properly to the shell and keep in mind that the anchor will be subjected to the full torque of the device. This solid anchoring is performed by the fasteners 37 mounted in the holes 60,61,62,63 in the bobbin and the housing.

Considering a coil with a uniform density of turns expressed as $N/2\alpha_o$, where N is the total number of turns and $\alpha_o$ is the half angle of the winding cavity as shown on FIG. 15, the total torque on the rotor is derived as the integral of the torque on each conductor.

Keeping in mind that the field B for each conductor at position $\alpha$ is a function of $\gamma$ and $\theta$ and that for each angular position $\gamma$ of the rotor the following relation exists:

$$\theta = \alpha - \gamma \quad (12)$$

The torque is expressed as:

$$T = \frac{KBrLNiD}{2\alpha_o} \int_{-\alpha_o}^{\alpha_o} \cos(\alpha - \gamma)\, d\alpha \quad (13)$$

which simplifies to:

$$T = KBrLNiD \frac{\sin\alpha_o}{\alpha_o} \cos\gamma \quad (14)$$

It is evident that $\sin\alpha_o/\alpha_o$ has maximum value for a small $\alpha_o$. Unfortunately this causes the resistance to increase proportionally for a given number of turns, N, as the wire must be of smaller gauge to fit in the small space defined by the small $\alpha_o$. To be practical, therefore, $\alpha_o$ should be as large as possible. If $\alpha_o$ is made to be 90° $\sin\alpha_o/\alpha_o = 0.82$. With $\alpha_o = 60°$, $\sin\alpha_o/\alpha_o = 0.87$.

With a variable coil density, it is possible to remove the $\sin\alpha_o/\alpha_o$ term ($\sin\alpha_o$ is always less than 1).

Let n be the winding density and $$2n = N/\alpha_o \cos\alpha \quad (15)$$

Equation 13 becomes:

$$T = \frac{KBrLNiD}{2\alpha_o} \int_{-\alpha_o}^{\alpha_o} [\cos(\alpha - \gamma)/\cos\alpha]\, d\alpha \quad (16)$$

which simplifies to:

$$T = \frac{KBrLNid}{\alpha_o} \cos\gamma \quad (17)$$

In practical terms this leads one to wind a coil where the winding density is less in the center than in the edges. If the windings extend between $+/- 45°$, the center should have a density of 71% of that of the edges. Designing according to (17), with $\alpha_o = 45°$, produces a torque around 40% greater than a coil designed with a uniform density, for a given power dissipation.

This varied density is shown diagrammatically in FIGS. 6 and 9 where it can be seen that there are fewer wires at the principal plane of symmetry 73 that separates the two coil portions 75, and more wires at the side radial surfaces of the bobbin, away from this plane. It is noted that the distribution need not follow (17) exactly, to reap the benefits of the invention, but that a better approximation should lead to better results.

This type of coil may be easily wound on the bobbin 50, using a winding machine, as the wires need not pass through the long, narrow cylindrical portion during winding. For this reason, motors with a high length to diameter ratio (e.g., well over 1) may be efficiently made.

Referring to FIGS. 17-21, a winding fixture permitting the variable winding density includes a pair of body portions 82, a pair of bullet plugs 84, and a fixturing fastener 77, such as a bolt 86 and associated nut 88 and washer 87. The body portions are essentially sections of a cylinder, and each have curved ends 90 and a hole 92. The bullet plugs 84 each include a nose 104 and a half-cylindrical section 106 with a hole 108. The fixturing fastener allows the inner surfaces of the body potions to be clamped around the bobbin and holds the bullet plugs in place within the bobbin.

The curved end surfaces 90 of the body and the curved nose 104 of the bullet plugs direct the wire as it is wound on the bobbin by the winding machine, to yield the above-described inverse cosine wiring density distribution. The actual achieved distribution will be a function of the bullet plug diameter 110, the spacing of the body portions, and the shapes of the curves on these portions. These parameters will also interact with other variables such as the type of winding machine used, its winding speed and tension, and the size of the wire. It is efficient to determine these parameters by a short series of trial-and-error experiments for a given winding machine and bobbin design.

FIG. 11 and 12 show an alternative embodiment of the bobbin. In this embodiment, annular segment end members 58 extend from its winding sections 55 at each end of each of the winding sections, and there are no generally beveled transition surfaces. Alternatively, the bobbin may be made in two pieces that are wound separately and assembled before potting.

The galvanometer presented thus possesses a solidly constructed, low diameter rotor that includes a large amount of magnet material within its relatively thin sleeve. It also has an easily wound coil that is long and narrow and possesses an optimized density profile. Furthermore, the placement of the link to the position transducer outside of the space between the bearings permits the bearings to be kept closer together, increasing the first resonance frequency. These features advantageously provide a significant aggregate improvement in the maximum output torque and bandwidth of the compact device.

Because of this level of performance improvement, it is necessary to solidly anchor the bobbin in place with a fastener, to prevent it from moving, as described above. This fastener mounting system provides for greater strength than potting alone, particularly for small diameter bobbins, where there is a smaller surface area to pot. This mounting system therefore prevents the coil from breaking free of the housing or shifting within the housing, as it might when subjected to the high magnetic forces.

Also, since the improved acceleration allows the rotor to hit the stops harder, it is advantageous that the joint between the output shaft 14 and the sleeve 26, and between the sleeve 26 and the magnet 27 are strong ones.

The present overall design is advantageous when compared to a moving iron device of similar characteristics. A moving iron device will have the same torque to inertia ratio, but the inductance of the device will be lower by a factor of ten. In order to make device of comparable size to a moving iron device, it is necessary to use a magnetic material that has a magnetic energy of about at least $25 \times 10^6$ gauss oersted. Neodymium iron boron and sumarium cobalt possesses these characteristics. The electrical time constant and the first uncontrollable resonant frequency are also favorably affected by this reduced inductance.

Other embodiments are within the following claims.

I claim:

1. A galvanometer having a desired performance characteristic comprising a cylindrical magnetic rotor mounted for rotary oscillation about a central axis, and being polarized into two essentially semi-cylindrical poles on opposite sides of said axis, two coil portions disposed on opposite sides of the rotor, each said coil portion defined by a large multiplicity of conductive turns, each said turn comprised of conductive side legs extending along the length of the rotor and conductive end portions connected to the respective side legs of the turn, the first and second side legs of the turn being grouped together in respective first and second groupings of conductive legs, with said groupings being spaced apart from each other circumferentially, there being a plane of symmetry through said axis between said coil portions, the legs of each grouping of turns of each coil portion being disposed in a varied distribution beginning at a point corresponding to the radial surface of the bobbin on which the coil portion is wound, and extending continuously substantially to said plane of symmetry, the pattern of said varied distribution being selected to optimize the torque imparted to said rotor for said desired performance characteristic, said poles of said rotor being in essential alignment with said plane at the center of the range of motion of said galvanometer.

2. The galvanometer of claim 1, wherein said rotor is a freely rotating rotor.

3. A galvanometer comprising a cylindrical magnetic rotor mounted for rotary oscillation about a central axis, and being polarized into two essentially semi-cylindrical poles on opposite sides of said axis, two coil portions disposed on opposite sides of the rotor, each said coil portion defined by a large multiplicity of conductive turns, each said turn comprised of conductive side legs extending along the length of the rotor and conductive end portions connected to the respective side legs of the turn, the first and second side legs of the turn being grouped together in respective first and second groupings of conductive legs, with said groupings being spaced apart from each other circumferentially, there being a plane of symmetry through said axis between said coil portions, the legs of each grouping of turns of each coil portion being disposed in a distribution beginning at a point corresponding to the radial surface of the bobbin on which the coil portion is wound, and extending continuously substantially to said plane of symmetry, wherein said distribution approximates a reciprocal cosine distribution, said poles of said rotor being in essential alignment with said plane at the center of the range of motion of said galvanometer.

4. The galvanometer of claim 3 wherein said distribution is determined by $$T = \frac{KBrLNiD}{\alpha_o} \cos\gamma$$

wherein

T is the galvanometer's torque output,

Br is the constant residual inductance of said magnetic rotor,

K is a non-dimensional constant,

L is the magnetic rotor length,

N is the number of turns in the coil, i is the current passing through the coil, D is the base diameter at which the conductors are placed, $\alpha_o$ is the half-angle of the winding cavity, and $\gamma$ is the angular position of the rotor.

5. The galvanometer of claim 3, wherein said variation of said winding extends over a range of +/− 45° degrees from said plane about said axis and said winding at said plane of symmetry has a density of about 70% of that at the outer limits of said range.

6. A galvanometer, comprising a magnet rotor adapted to rotate about an axis, and a stator concentric with said rotor and including a coil having axial winding portions on opposite sides of said axis and a plane of symmetry passing through said axis and separating said axial coil portions, said coil having a varied winding density distribution that is lower in density at said plane of symmetry than spaced therefrom.

7. The galvanometer of claim 6, wherein said variation of said winding density distribution is selected to optimize performance of the coil for a given power dissipation of said coil.

8. The galvanometer of claim 6, wherein said variation of said winding density distribution approximates a reciprocal cosine distribution.

9. The galvanometer of claim 8 wherein said distribution is determined by $$T = \frac{KBrLNiD}{\alpha_o} \cos\gamma$$

wherein
T is the galvanometer's torque output,
Br is the constant residual inductance of said magnetic rotor,
K is a non-dimensional constant,
L is the magnetic rotor length,
N is the number of turns in the coil,
i is the current passing through the coil,
D is the base diameter at which the conductors are placed,
$\alpha_o$ is the half-angle of the winding cavity, and
$\gamma$ is the angular position of the rotor.

10. The galvanometer of claim 6, wherein said variation of said winding extends over a range of +/− 45° degrees from said plane about said axis and said winding at said plane of symmetry has a density of about 70% of that at the outer limits of said range.

11. The galvanometer of claim 6, wherein said coil portions are located on a bobbin comprising
a cylindrical portion with inner and outer cylindrical surfaces,
two cylindrical winding sections projecting from said outer surface on opposing sides of said cylindrical portion and each having an outer surface, longitudinal radial surfaces and first and second end surfaces, said axis and the axis of said cylindrical portion being essentially co-linear, said surfaces being adapted to receive said coil portion.

12. The galvanometer of claim 11, wherein said bobbin is constructed to form a heat conductive path for sinking heat generated by said coil.

13. The galvanometer of claim 11 wherein said cylindrical sections define at least one pair of anchor holes for accepting a fastener that holds said bobbin in place.

14. The galvanometer of claim 11 wherein said cylindrical winding sections further include generally beveled transition surfaces between said radial and said end surfaces.

15. The galvanometer of claim 11 wherein said cylindrical sections each further include annular segment end members, which extend from said winding sections at each end of each of said winding sections.

16. The galvanometer of claim 6 in the form of a scanner adapted to drive an optical element such as a mirror in a rotational oscillatory scanning motion, said galvanometer further comprising:
a stationary outer shell,
said stator being potted with structural potting material to a coil wound around a bobbin disposed within said shell, said stator comprised of an anchoring hole disposed toward the shell, and
a rigid fastener element fitted in said hole, and extending to said shell, adapted to anchor said stator to said shell to prevent relative rotational motion therebetween during acceleration of said galvanometer during which reactive forces are applied to said coil.

17. The galvanometer of claim 16, wherein said fastener is an axially extending element in the form of a pin or bolt.

18. The galvanometer of claim 16 wherein said rotor is on the order of half an inch in diameter or smaller.

19. The galvanometer of claim 16 wherein said rotor is on the order of three sixteenths of an inch in diameter or smaller.

20. The galvanometer of claim 16 wherein said rotor has a length longer than its diameter.

21. The galvanometer of claim 16 wherein said rotor length is about three times said rotor diameter or longer.

22. The galvanometer of claim 6 further comprising:
an output shaft and a rear shaft located on opposing ends of said rotor,
an output bearing for connection to an external load, said output bearing rotatably holding said output shaft,
a rear bearing rotatably holding said rear shaft, said bearing being placed at the opposite end of said rotor to said output bearing, and
a position transducer linked to said rotor for generating a feedback signal in response to the rotation of said rotor, said position transducer being linked to said rotor outside of the space between said bearings, in order to minimize the distance between said bearings and consequently favorably affect the first resonance frequency of said rotor.

23. The galvanometer of claim 22, wherein said position transducer is mounted on said rear shaft.

24. The galvanometer of claim 22, wherein said position transducer is mounted on said rear shaft by a screw engaged in threads of said rear shaft.

* * * * *